(12) United States Patent
Chan et al.

(10) Patent No.: US 7,378,616 B2
(45) Date of Patent: May 27, 2008

(54) HEATING APPARATUS AND METHOD FOR SEMICONDUCTOR DEVICES

(75) Inventors: Tin Kwan Bobby Chan, Singapore (SG); Choong Kead Leslie Lum, Singapore (SG)

(73) Assignee: ASM Technology Singapore Pte. Ltd., Singapore (SG)

( * ) Notice: Subject to any disclaimer, the term of this patent is extended or adjusted under 35 U.S.C. 154(b) by 439 days.

(21) Appl. No.: 11/144,330

(22) Filed: Jun. 3, 2005

(65) Prior Publication Data

US 2005/0274708 A1    Dec. 15, 2005

Related U.S. Application Data

(60) Provisional application No. 60/578,932, filed on Jun. 10, 2004.

(51) Int. Cl.
*F27D 11/00*    (2006.01)
*H01L 23/48*    (2006.01)

(52) U.S. Cl. .................. 219/392; 219/543; 361/234; 257/734; 257/735; 257/700; 257/451; 257/738; 257/791; 257/778; 438/120; 438/612; 438/108; 156/580.2; 156/580

(58) Field of Classification Search ............... 219/543, 219/392; 361/234; 257/734–735, 700, 451, 257/738, 791, 778; 438/120, 612, 108; 156/580.2, 156/580
See application file for complete search history.

(56) References Cited

U.S. PATENT DOCUMENTS 5,671,117 A  *  9/1997  Sherstinsky et al. ........ 361/234

* cited by examiner

*Primary Examiner*—Shawntina Fuqua
(74) *Attorney, Agent, or Firm*—Ostrolenk, Faber, Gerb & Soffen, LLP

(57) ABSTRACT

A heating apparatus and method for heating a semiconductor device during bonding of electrical contacts onto the device is provided, which includes a heating plate that is provided for heating the semiconductor device and a layer of compliant material extending over at least a portion of the heating plate for mounting the semiconductor device. A holding mechanism secures the semiconductor device on the layer of compliant material during bonding of electrical contacts onto the semiconductor device while it is being heated by the heating plate.

19 Claims, 2 Drawing Sheets

HEATING APPARATUS AND METHOD FOR SEMICONDUCTOR DEVICES

CROSS REFERENCE TO RELATED APPLICATION

This application claims the benefit and priority of U.S. Provisional Application Ser. No. 60/578,932 filed Jun. 10, 2004, and entitled HEATING APPARATUS FOR SEMICONDUCTOR DEVICES, the disclosure of which is incorporated herein by reference.

FIELD OF THE INVENTION

The invention relates to a heating apparatus for heating a semiconductor device, such as a semiconductor wafer or substrate comprising or containing a plurality of semiconductor chips. In particular, the heating apparatus may be used during the bonding of electrical contacts comprising metallic material onto bonding locations of the semiconductor device.

BACKGROUND AND PRIOR ART

Flip chip microelectronic assembly is well-established in the semiconductor industry. The assembly process involves the direct electrical connection of face-down electronic components onto substrates, circuit boards or carriers by means of conductive bumps on the chip bond pads. In contrast, older technology involves wire bonding of each bond pad of face-up chips to substrates, circuit boards or carriers. The advantages of flip chip packaging over older technology include smaller size, better performance, increased flexibility, reliability and lower cost. For example, eliminating packages and bond wires reduces the required board area by up to 95%, and requires far less height. Weight can be less than 5% of packaged device weight. In fact, the flip chip can be even smaller than Chip Scale Packages (CSP) because its size is the size of a chip. Flip chip materials are also becoming more widely available, further lowering production costs.

A conductive bump serves several functions in flip chip assembly. Electrically, the bump provides a conductive path from chip to substrate. The bump also provides a thermally conductive path to carry heat from the chip to the substrate. In addition, the bump provides part of the mechanical mounting of the chip to the substrate. Finally, the bump provides a spacer, preventing electrical contact between the chip and substrate conductors, and acting as a short lead to relieve mechanical strain between chip and substrate.

One method of forming bumps on semiconductor wafers comprises a process known as stud bumping, which creates bumps on wafer chips by a wire bonding technique that is modified from the older wire bonding technology. This technique makes a ball for wire bonding by melting the end of a wire to form a sphere. The ball is attached to the chip bond pad as the first part of a wire bond. To form bumps instead of wire bonds, wire bonders are modified to break off the wire after attaching the ball to the chip bond pad. The ball, or "stud bump" remaining on the bond pad provides a permanent connection to the underlying metal on the chip. Traditionally, gold wire is used in stud bumping. However, copper wire, which is relatively cheaper, is gaining wider acceptance in the industry.

In current stud bumping systems, a semiconductor wafer is typically placed onto a top plate or heating plate of a vacuum chuck, and held directly on the heating plate using vacuum suction. The heating plate may be made of a variety of material, such as porous ceramic, or anodized or nickel plated aluminum. A plurality of vacuum holes are included on the surface of the heating plate to exert vacuum suction force for securing the wafer on the heating plate. Thereafter, gold or copper bumps are bonded or bumped onto the heated semiconductor wafer.

Traditionally, the heating plate for heating the wafer is made rigid and non-compliant in order to provide adequate support for the wafer during bonding. One reason is that compliant material is generally more vulnerable to heat damage as compared to, say a metallic support, which might put the wafer at risk of damage during bonding. Another reason is that if the surface is compliant or resilient, it may be more difficult to control the tolerances of the bonding process and may for instance result in damage due to excessive flexion of the semiconductor device during bonding due to flexibility of the underlying support layer.

However, it was discovered that the traditional approach of implementing a rigid mounting support for stud bumping of a semiconductor wafer has a number of problems. One problem is that whilst the heating plate has to be machined to be as flat as possible, there are often differences between the contours of the surface of the semiconductor wafer and the contours of the heating plate that are in contact. Such unevenness in the surface of the heating plate or non-conformity in contours of the surfaces sometimes leads to vacuum leakage, which diminishes the vacuum suction force securing the wafer to the heating plate. Cratering or peeling of a bond pad on the semiconductor wafer has been known to occur through direct contact of the wafer on the heating plate surface. Moreover, in some types of semiconductor wafers, it was also found that the back surface of the semiconductor wafer in contact with the heating plate had a propensity to peel off after the stud bumping process. For the above reasons, there is a need to mitigate the shortcomings of utilizing rigid mounting supports.

SUMMARY OF THE INVENTION

It is thus an object of the invention to seek to provide an improved heating apparatus that avoids at least some of the aforesaid problems of the prior art.

According to a first aspect of the invention, there is provided a heating apparatus for heating a semiconductor device during bonding of electrical contacts onto the device comprising: a heating plate for heating the semiconductor device; a layer of compliant material extending over at least a portion of the heating plate for mounting the semiconductor device; and a holding mechanism constructed and configured to secure the semiconductor device on the layer of compliant material during bonding of electrical contacts onto the semiconductor device while it is being heated by the heating plate.

According to a second aspect of the invention, there is provided a method of heating a semiconductor device during bonding of electrical contacts onto the device, comprising the steps of: providing a heating plate having a layer of compliant material extending over at least a portion of the heating plate; placing a semiconductor device on the compliant material; securing the semiconductor device against the compliant material with a holding mechanism; and thereafter bonding electrical contacts onto the semiconductor device while heating it with the heating plate.

It would be convenient hereinafter to describe the invention in greater detail by reference to the accompanying drawings which illustrate one embodiment of the invention.

The particularity of the drawings and the related description is not to be understood as superseding the generality of the broad identification of the invention as defined by the claims.

BRIEF DESCRIPTION OF THE DRAWINGS

An example of a preferred embodiment of an apparatus and method in accordance with the invention will now be described with reference to the accompanying drawings, in which.

DETAILED DESCRIPTION OF THE PREFERRED EMBODIMENT

Figure 1:
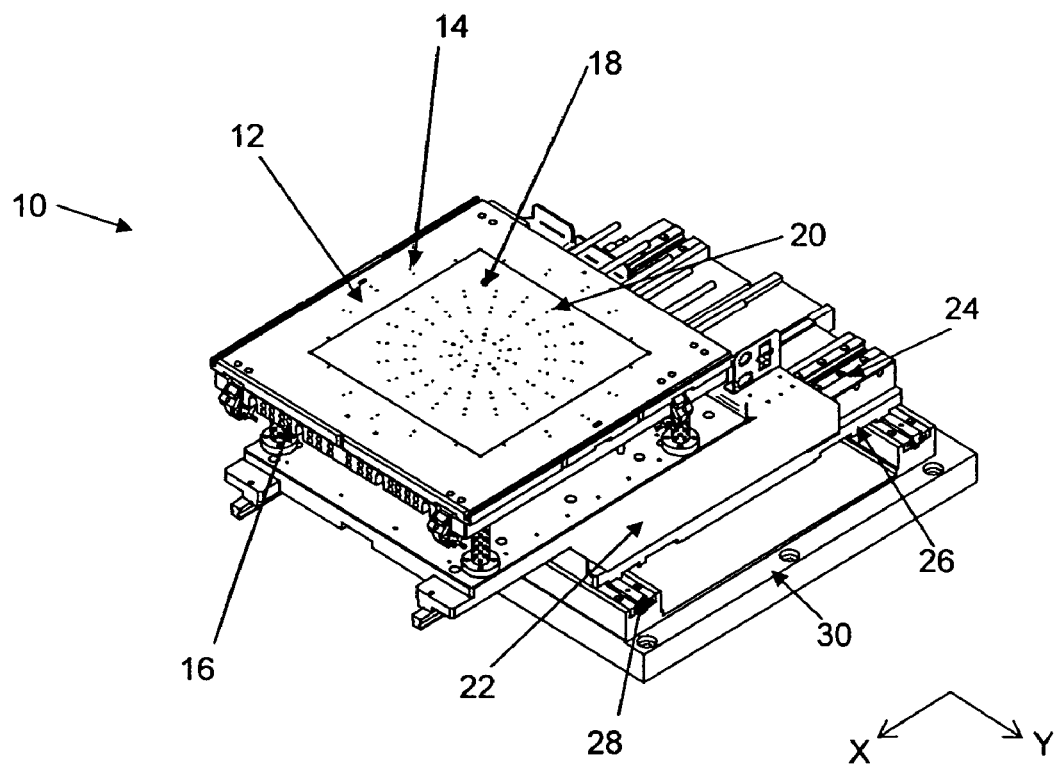
FIG. 1 is an isometric view of a stud bumping apparatus including a heating plate that has a layer of compliant material on its surface according to the preferred embodiment of the invention.

FIG. 1 is an isometric view of a bonding or stud bumping apparatus 10 including a heating surface in the form of a heating plate 12 comprising a layer of compliant material 18 on its surface extending over at least a portion of the heating plate 12 according to the preferred embodiment of the invention. The heating plate 12 has a holding mechanism that preferably comprises a number of vacuum suction holes 14. Vacuum suction force is generated through these vacuum suction holes 14 whereby to hold a semiconductor device such as a semiconductor wafer onto the compliant material 18 on the heating plate 12 for bonding electrical contacts such as metallic material onto the wafer in a stud bumping process. Accordingly, the electrical contacts are preferably in the form of stud bumps or ball bonds. The heating plate 12 is heated by a heater block 16 located underneath the heating plate 12, which in turn provides heat to the semiconductor wafer during bonding.

The layer of compliant material 18 is incorporated onto the top surface of the heating plate 12 at least over a position where the semiconductor wafer is to be mounted for stud bumping. The compliant material 18 is preferably configured such that it can withstand typical bonding temperatures, which may be about 200° C. and above. At these temperatures, the compliant material 18 must not soften or incur other perceptible heat damage. The compliant material 18 preferably comprises polyimide. The layer of compliant material 18 may be in the form of a tape secured to the heating plate 12 using an adhesive material, such as silicon adhesive. It can also be secured to the heating plate 12 by the use of other mechanisms, for example mechanical devices such as clamps. Alternatively, the compliant material 18 may comprise a thin coating that is coated onto the surface of the heating plate 12 where a semiconductor device is to be mounted.

In order to allow fluid communication between the vacuum suction holes 14 and the semiconductor wafer mounted on the layer of compliant material 18, a plurality of through-holes 20 with positions that match the locations of the vacuum suction holes 14 of the heating plate 12 are formed in the layer of compliant material 18 by mechanically punching the through-holes or other means. Alternatively, the heating plate 12 may be coated with a layer of compliant material 18 without closing up the vacuum suction holes 14.

The heating plate 12 and heater block 16 are preferably mounted on top of a positioning device, such as an X-Y table. The X-Y table is operative to move and position the semiconductor device for bonding electrical contacts thereon. The X-Y table may comprise an X stage 22 that is movable on X guide rails 24 in a first linear direction, and a Y stage 26 that is movable together with the X stage 22 and X guide rails 24 on Y guide rails 28 in a second linear direction perpendicular to the first linear direction. The positioning device may be mounted on a base 30.

Figure 2:
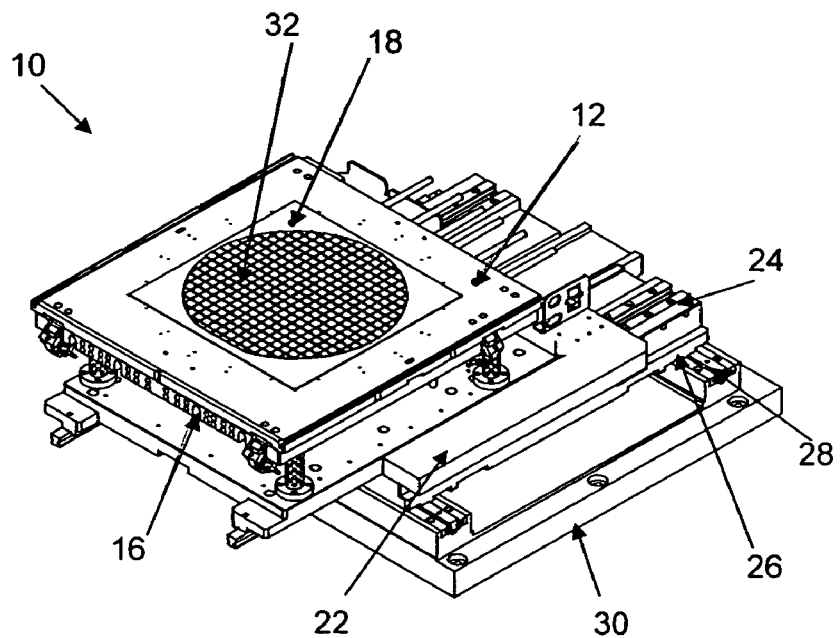
FIG. 2 is an isometric view of the apparatus of FIG. 1 including a semiconductor wafer placed on the layer of compliant material.

FIG. 2 is an isometric view of the apparatus 10 of FIG. 1 including a semiconductor wafer 32 placed on the layer of compliant material 18. The semiconductor wafer 32 is mounted substantially centrally on the heating plate 12 on a portion of the heating plate 12 that is covered with the layer of compliant material 18. Vacuum suction force generated from the vacuum holes 14 via the through-holes 20 formed in the compliant material 18 are operative to secure the wafer 32 onto the compliant material 18 during the said stud bumping process.

Figure 3:
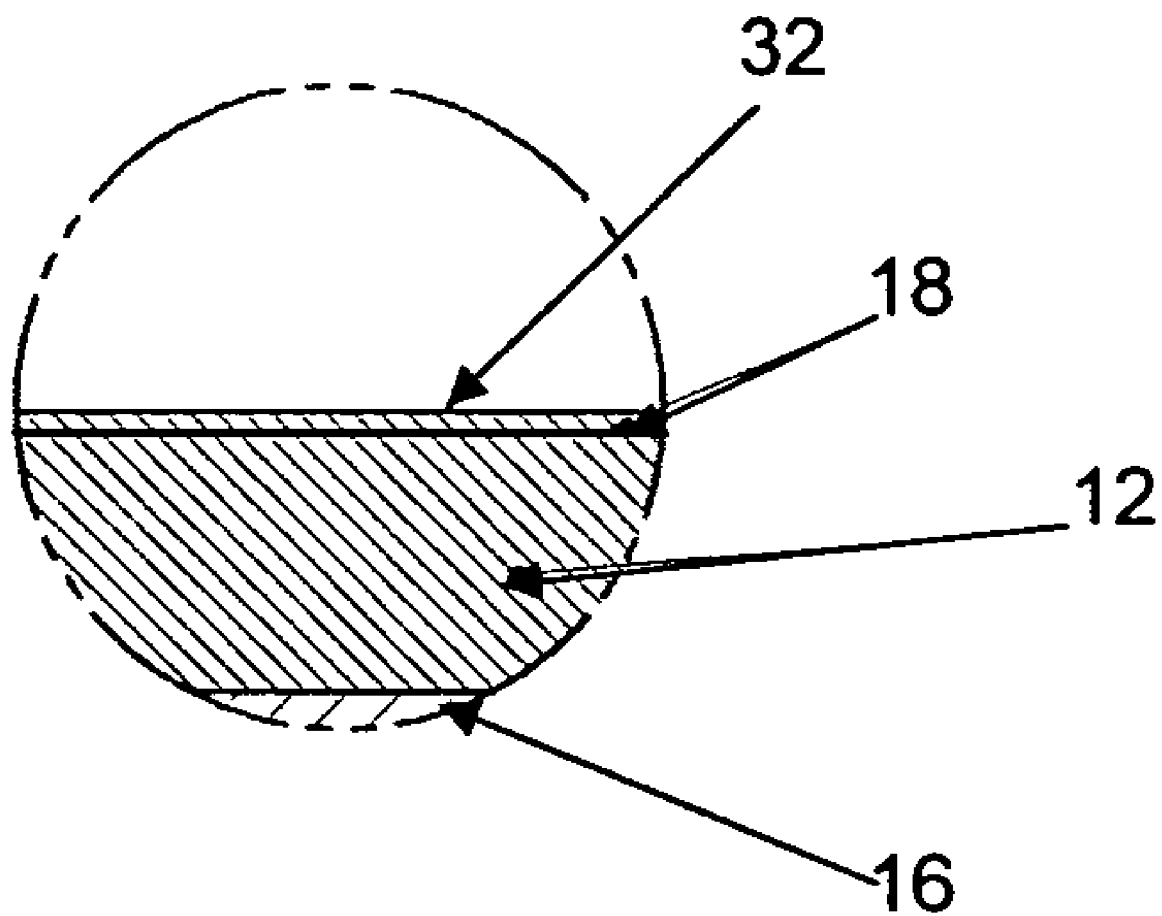
FIG. 3 is a cross-sectional side view of a wafer placed on the layer of compliant material covering the heating plate.

FIG. 3 is a cross-sectional side view of a wafer 32 placed on the layer of compliant material 18 over the heating plate 12. The heating plate 12 sits on the heater block 16 for heating by the heater block 16. The thickness of the compliant material 18 is preferably less than the thickness of the wafer 32. In one embodiment of the invention, the thickness of the compliant material 18 may be in the range of between 0.02 mm and 1.2 mm. More preferably, the thickness of the layer of compliant material 18 is in the range of between 0.1 mm and 0.3 mm, where the thickness of the wafer is between 0.3 mm and 0.8 mm.

It would be appreciated that the layer of compliant material 18 may act as a damper for the semiconductor wafer 32 to be bonded to. Amongst other things, it helps to absorb shock caused by ultrasonic bonding and thereby reduce high frequency vibration due to bonding impact. It also helps to reduce vacuum leakage and compensate for any unevenness in the surface of the heating plate 12 and/or the semiconductor wafer 32. Hence, a higher level of vacuum suction force can be implemented during bonding to improve bonding accuracy. Improved bonding quality can thus be achieved and problems with cratering and peeling of the metal coating of the wafer can be avoided.

The invention described herein is susceptible to variations, modifications and/or additions other than those specifically described and it is to be understood that the invention includes all such variations, modifications and/or additions which fall within the spirit and scope of the above description.

The invention claimed is:

1. A heating apparatus for heating a semiconductor device during bonding of electrical contacts onto the device, the heating apparatus comprising:
   a heating plate for heating the semiconductor device;
   a shock-absorbing layer of compliant material extending over at least a portion of the heating plate, the semiconductor device being mounted on the shock-absorbing layer of compliant material; and
   a holding mechanism operable to secure the semiconductor device on the layer of compliant material during bonding of electrical contacts onto the semiconductor device while the semiconductor device is being heated by the heating plate.

2. The heating apparatus as claimed in claim 1, wherein the holding mechanism comprises a plurality of vacuum suction holes formed in the heating plate, and the layer of compliant material further comprises a plurality of through-holes formed in the compliant material with positions corresponding to locations of the plurality of vacuum suction holes for permitting fluid communication between the vacuum suction holes and the semiconductor device mounted on the compliant material.

3. The heating apparatus as claimed in claim 1, wherein the layer of compliant material comprises a tape secured to the heating plate by an adhesive.

4. The heating apparatus as claimed in claim 3, wherein the adhesive comprises a silicon adhesive.

5. The heating apparatus as claimed in claim 1, wherein the layer of compliant material comprises a coating that is coated onto a surface of the heating plate.

6. The heating apparatus as claimed in claim 1, wherein a thickness of the layer of compliant material is less than a thickness of the semiconductor device.

7. The heating apparatus as claimed in claim 6, wherein the thickness of the layer of compliant material is between 0.02 mm and 1.2 mm.

8. The heating apparatus as claimed in claim 7, wherein the thickness of the layer of compliant material is between 0.1 mm and 0.3 mm.

9. The heating apparatus as claimed in claim 1, wherein the compliant material withstands temperatures of 200° C. and above without softening or incurring other perceptible heat damage.

10. The heating apparatus as claimed in claim 1, wherein the compliant material comprises polyimide.

11. The heating apparatus as claimed in claim 1, further comprising a positioning device for mounting the heating plate, the positioning device being operable to move and position the semiconductor device for bonding electrical contacts at different positions thereon.

12. The heating apparatus as claimed in claim 1, wherein the electrical contacts comprise stud bumps or ball bonds.

13. A method of heating a semiconductor device during bonding of electrical contacts onto the device, the method comprising the steps of:

providing a heating plate having a shock-absorbing layer of compliant material extending over at least a portion of the heating plate;

placing a semiconductor device on the shock-absorbing layer of compliant material;

securing the semiconductor device against the shock-absorbing layer of compliant material with a holding mechanism; and thereafter bonding electrical contacts onto the semiconductor device while heating the semiconductor with the heating plate.

14. The method as claimed in claim 13, further comprising the steps of forming a plurality of vacuum suction holes in the heating plate and forming a plurality of through-holes in the shock-absorbing layer of compliant material with positions corresponding to locations of the vacuum suction holes for permitting fluid communication between the vacuum suction holes and the semiconductor device mounted on the compliant material.

15. The method as claimed in claim 13, wherein the layer of compliant material comprises a tape secured to the heating plate by an adhesive.

16. The method as claimed in claim 15, wherein the adhesive comprises a silicon adhesive.

17. The method as claimed in claim 13, wherein the shock-absorbing layer of compliant material comprises a coating that is coated onto a surface of the heating plate.

18. The method as claimed in claim 13, wherein the compliant material comprises polyimide.

19. The method as claimed in claim 13, wherein the electrical contacts comprise stud bumps or ball bonds.

* * * * *